United States Patent
Zhang et al.

(10) Patent No.: US 10,433,421 B2
(45) Date of Patent: Oct. 1, 2019

(54) REDUCED CAPACITANCE LAND PAD

(71) Applicant: INTEL CORPORATION, Santa Clara, CA (US)

(72) Inventors: Zhichao Zhang, Chandler, AZ (US); Tao Wu, Chandler, AZ (US); Gaurav Chawla, Chandler, AZ (US); Jeffrey Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1061 days.

(21) Appl. No.: 13/727,439

(22) Filed: Dec. 26, 2012

(65) Prior Publication Data

US 2014/0174808 A1   Jun. 26, 2014

(51) Int. Cl.
  *H05K 1/11* (2006.01)
  *H05K 1/02* (2006.01)
  *H05K 3/34* (2006.01)

(52) U.S. Cl.
  CPC ............. *H05K 1/113* (2013.01); *H05K 1/025* (2013.01); *H05K 1/0243* (2013.01); *H05K 3/3452* (2013.01); *H05K 2201/0969* (2013.01); *H05K 2201/09663* (2013.01); *H05K 2201/09881* (2013.01); *H05K 2201/10719* (2013.01); *Y10T 29/49165* (2015.01)

(58) Field of Classification Search
  CPC ...... H05K 1/113; H05K 1/0243; H05K 1/025; H05K 2201/09663; H05K 2201/0969; H05K 2201/09881; H05K 2201/10719; H05K 3/3452; Y10T 29/49165
  USPC ........................................ 174/261, 250, 68.1
  See application file for complete search history.

(56) References Cited

U.S. PATENT DOCUMENTS

| | | | | |
|---|---|---|---|---|
| 5,519,176 A | * | 5/1996 | Goodman | H01L 23/49822 174/250 |
| 5,815,919 A | * | 10/1998 | Nakanishi | H05K 3/3421 228/180.1 |
| 6,184,478 B1 | * | 2/2001 | Imano | H05K 1/0253 174/255 |
| 6,287,950 B1 | * | 9/2001 | Wu | H01L 24/03 257/E21.508 |
| 6,433,441 B1 | * | 8/2002 | Niwa | H01L 23/49838 257/691 |
| 6,584,685 B2 | * | 7/2003 | Chung | H05K 7/1092 29/854 |
| 6,825,541 B2 | * | 11/2004 | Huang | H01L 24/13 257/459 |

(Continued)

OTHER PUBLICATIONS

Wikepedia Definiton of "Copper".*

*Primary Examiner* — Dimary S Lopez Cruz
(74) *Attorney, Agent, or Firm* — Schwabe, Williamson & Wyatt, P.C.

(57) ABSTRACT

A land grid array (LGA) land pad having reduced capacitance is disclosed. The conductive portion of a land pad that overlaps a parallel ground plane within the substrate is reduced by one or more non-conductive voids though the thickness of the conductive portion of the land pad. The voids may allow the contact area of the land pad, as defined by the perimeter of the land pad, to remain the same while reducing the conductive portion that overlaps the parallel ground plane. Capacitance between the land pad and the parallel ground plane is reduced by an amount proportional to the reduction in overlapping conductive area.

11 Claims, 9 Drawing Sheets

(56) References Cited

U.S. PATENT DOCUMENTS

| | | | |
|---|---|---|---|
| 6,897,570 B2* | 5/2005 | Nakajima | H01L 23/5226 |
| | | | 257/773 |
| 7,034,391 B2* | 4/2006 | Pendse | H01L 23/49838 |
| | | | 257/691 |
| 7,227,247 B2* | 6/2007 | Zeng | H01L 23/49822 |
| | | | 257/678 |
| 8,025,531 B1* | 9/2011 | Zhang | H01R 12/52 |
| | | | 439/607.05 |
| 8,409,979 B2* | 4/2013 | Choi | H01L 21/565 |
| | | | 257/738 |
| 9,313,877 B2* | 4/2016 | Ishida | H05K 1/0236 |
| 2003/0201123 A1* | 10/2003 | Kistner | H05K 1/116 |
| | | | 174/261 |
| 2004/0070079 A1* | 4/2004 | Huang | H01L 24/05 |
| | | | 257/778 |
| 2006/0237855 A1* | 10/2006 | Kroehnert | H01L 23/49816 |
| | | | 257/779 |
| 2010/0126758 A1* | 5/2010 | Akai | H05K 3/384 |
| | | | 174/257 |
| 2013/0180771 A1* | 7/2013 | Freitag | H05K 1/11 |
| | | | 174/261 |
| 2014/0124242 A1* | 5/2014 | Ito | H05K 1/111 |
| | | | 174/250 |
| 2015/0014848 A1* | 1/2015 | Lin | H01L 24/81 |
| | | | 257/737 |

\* cited by examiner

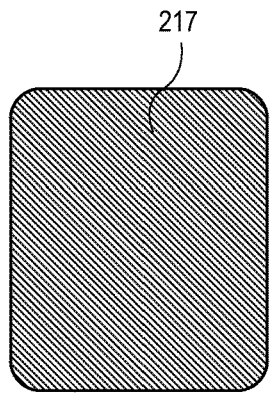
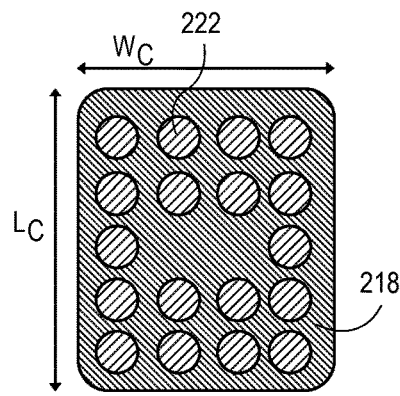
FIG. 2A
(PRIOR ART)
FIG. 2B
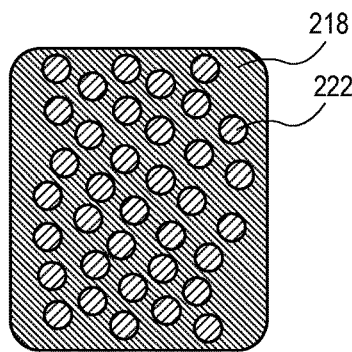
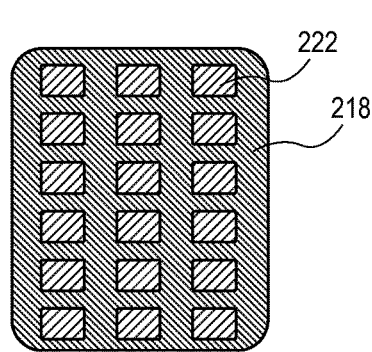
FIG. 2C
FIG. 2D
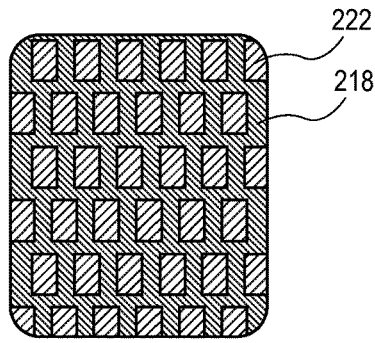
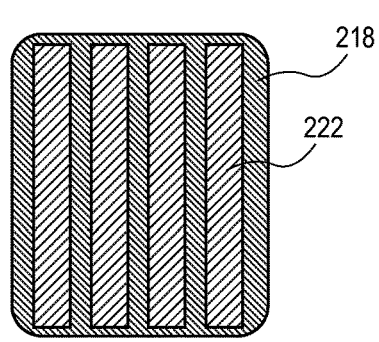
FIG. 2E
FIG. 2F

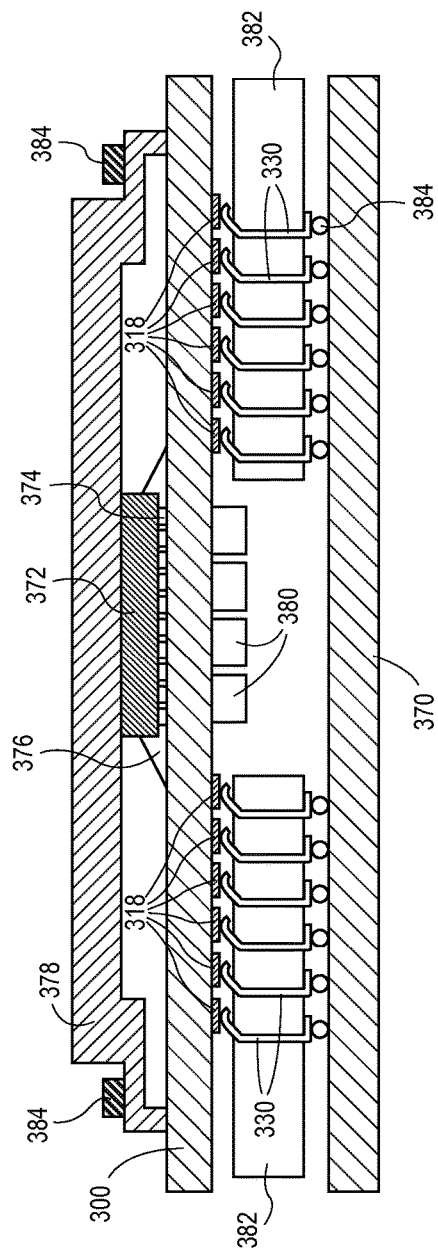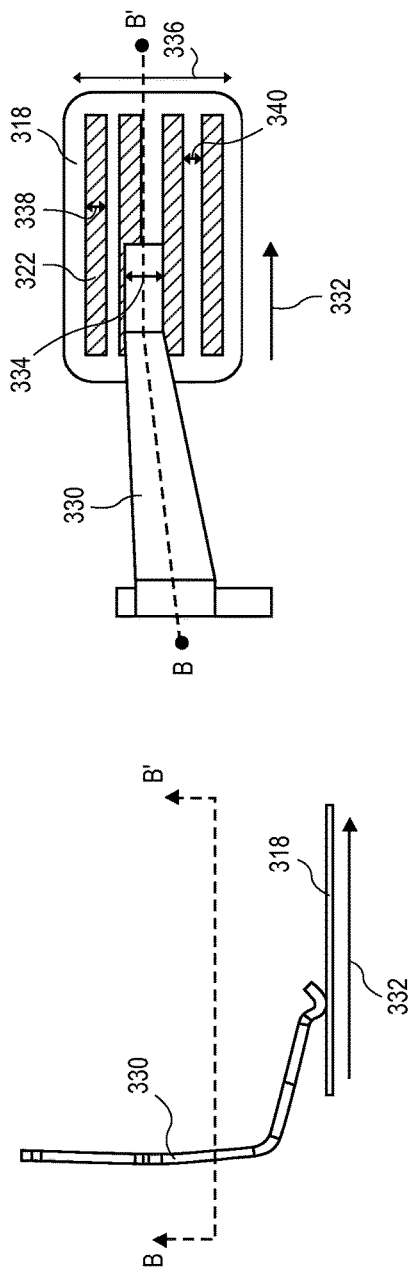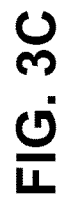
FIG. 3A
FIG. 3B
FIG. 3C

REDUCED CAPACITANCE LAND PAD

BACKGROUND

Mobile, tablet, and laptop computing systems require semiconductor devices that are smaller, have greater processing capability, and consume less power. However, as semiconductor device dimensions shrink, device component interactions can become increasingly significant. Management and reduction of energy losses associated with component interaction enables reduced power consumption for smaller, more powerful devices.

BRIEF DESCRIPTION OF THE DRAWINGS

FIG. 2A illustrates a solid land pad, according to the prior art.

FIGS. 2B-2F illustrate a top-down view of a reduced capacitance land pad, in accordance with an embodiment of the invention.

FIG. 3A illustrates a semiconductor package mounted to a circuit board via a land grid array, in accordance with an embodiment of the invention.

FIG. 3B illustrates cross-sectional side view of an LGA contact in contact with a reduced capacitance land pad, in accordance with an embodiment of the invention.

FIG. 3C illustrates a top-down view of an LGA contact in contact with a reduced capacitance land pad, in accordance with an embodiment of the invention.

DETAILED DESCRIPTION

Figure 1A:
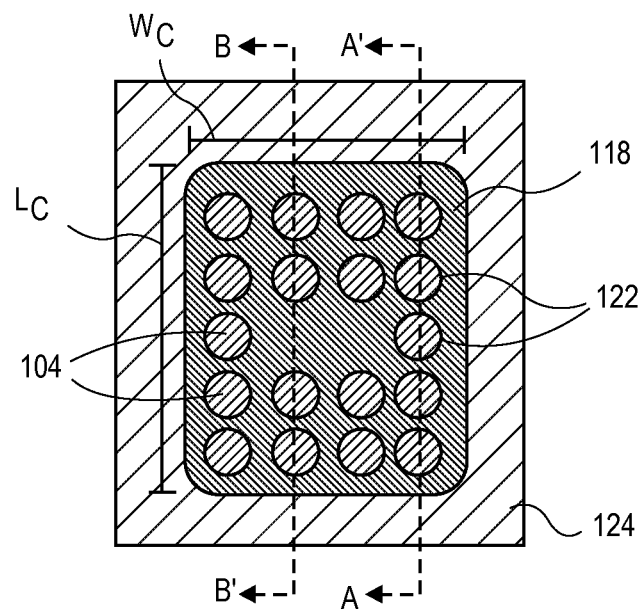
FIGS. 1A-1C illustrate a reduced capacitance land pad, in accordance with an embodiment of the invention.

A land pad having a conductive area less than the contact area and a method of forming the land pad are described. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The impedance of an electrical circuit is the measure of the opposition to the passage of a current when a voltage is applied. Where a voltage is applied across the interface of two materials or components, the impedance discontinuity between the components leads to current reflection and energy loss. Capacitance between a package land pad on a substrate surface and a parallel conductive layer within the substrate, such as an adjacent ground plane or a power plane, is a major source of impedance discontinuity in a land grid array (LGA) interconnecting a substrate and a printed circuit board (PCB). As plated through hole and LGA socket dimensions decrease, the capacitance between the land pad and the parallel conductive plane becomes even more significant. Reducing the capacitance between the land pad and the conductive plane can reduce the impedance discontinuity, which in turn decreases signal loss. Interconnections carrying high frequency signals are particularly sensitive to losses, and so would especially benefit from incorporating a reduced capacitance land pad.

In one aspect, embodiments of the invention describe a land pad having reduced capacitance and associated reduced signal loss as compared to conventional land pads having the same contact area. The contact area of a land pad, the area to which an LGA contact can electrically couple, is defined by the perimeter of the land pad. In an embodiment, the contact area contains one or more conductive portions and one or more non-conductive voids. Including one or more voids extending through the contact area of the land pad reduces the conductive area of the land pad that overlaps and capacitively couples with a parallel ground plane. Because the contact area of the reduced capacitance land pad is greater than the conductive area, a larger tolerance is permitted for positioning of the LGA contact as compared to the tolerance of a solid land pad having the same conductive area and associated capacitance. In a reduced capacitance land pad, the width of the widest void is less than the width of the tip of the LGA contact to ensure that the LGA contact tip is in electrical contact with a conductive portion of the land pad.

In another aspect, the reduced capacitance land pad does not require further changes to the device structure or fabrication process. For example, the land pad reduces capacitance without increasing the amount of dielectric material between the land pad and the parallel ground layer, enabling low z-height assemblies. In addition, the capacitance is reduced without using a dielectric material having a lower dielectric constant between the land pad and the parallel ground layer. Use of a lower dielectric material between the land pad and the parallel ground layer may reduce the capacitance, but the lower dielectric material may additionally lead to stresses within the substrate due to thermal expansion mismatch with layers including different dielectric materials, or use of a lower dielectric material may require changes to the fabrication process. Furthermore, the reduced capacitance land pad does not require the addition of lumped inductors or high impedance routing traces within the package next to the land pad to compensate for the capacitance between the land pad and the parallel ground layer.

In another aspect, the reduced capacitance land pad enables increased or maintained structural integrity of the substrate by eliminating or reducing the antipad volume within the parallel conductive layer. In order to reduce the capacitance by reducing the overlapping conductive area of the land pad and the parallel conductive layer, a void, or antipad, may be formed within the overlapping portion of the conductive layer. An antipad void can lead to copper density reduction and package stiffness and reliability concerns, and for ground planes may also reduce the effectiveness of charge dissipation. By instead reducing the conductive area of the land pad, the capacitance can be reduced while removing less or no material from the parallel conductive layer.

Figure 1B:
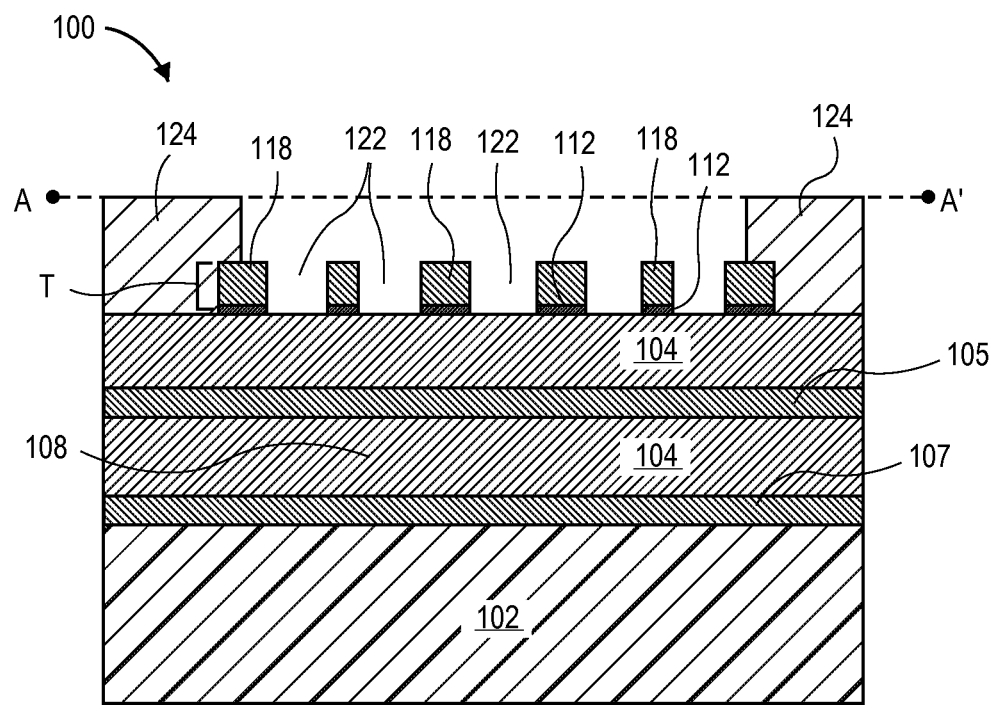
Figure 1C:
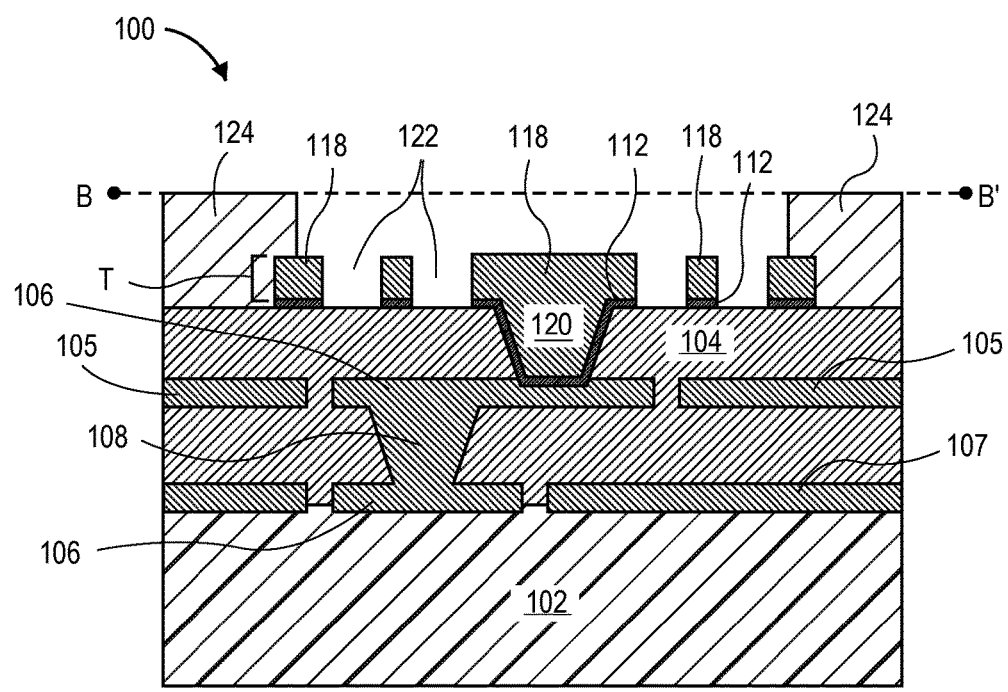

FIGS. 1A-C illustrate a land pad having an conductive area that is less than the contact area of the pad, according to an embodiment of the invention. FIG. 1A illustrates a top-down view of land pad 118, according to an embodiment. In an embodiment, land pad 118 is surrounded by solder mask 124. The contact area is defined by the perimeter of land pad 118. In an embodiment, the perimeter and contact area of land pad 118 are defined by length $L_c$ and width $W_c$. In an embodiment, an LGA contact can make electrical contact with land pad 118 by contacting the land pad 118 within the contact area. Land pad 118 has one or more voids 122, according to an embodiment of the invention. In an embodiment, voids 122 extend through land pad 118 to expose underlying dielectric material 104. In an embodiment, voids 122 are non-conductive. In another embodiment, voids 122 are electrically isolated from the conductive portions of land pad 118. The conductive area is defined as the contact area minus the area occupied by non-conductive voids 122, according to an embodiment.

FIG. 1B illustrates a cross-sectional side view along line A-A' in FIG. 1A. In an embodiment, land pad 118 is formed over the surface of substrate 100. Substrate 100 includes dielectric layers 104 formed on a core 102, according to an embodiment. In an embodiment, substrate 100 includes ground plane 105 underlying at least a portion of land pad 118. Substrate 100 may also include a power plane 107 formed on core 102. It is to be understood that substrate 100 may include additional dielectric layers 104 and conductive elements beyond those shown in FIG. 1B for illustrative purposes. In an embodiment, additional dielectric layers and conductive traces and planes (not shown) are formed on the surface of core 102 opposite land pad 112, and electrically coupled with conductive elements 105 and 107 by plated through holes (not shown) formed in core 102. Core 102 may be formed from any suitable material known in the art, such as fiberglass-epoxy composite. Dielectric material 104 may be any suitable material, such as, but not limited to, ABF. Ground plane 105 and power plane 107 may be any suitable conductive material, such as, but not limited to, copper. Land pad 118 may include any suitable conductive material, for example, but not limited to, copper. In an embodiment, land pad 118 has a thickness T from 10 µm to 20 µm. In an embodiment, land pad 118 is formed on a seed layer 112. In an embodiment, seed layer 112 is copper.

Solder mask 124 surrounding land pad 118 may be any conventional solder mask material, such as, for example, SR7300GR.

In an embodiment, ground plane 105 is parallel to and electrically isolated from land pad 118, which may give rise to capacitance between the overlapping conductive portions. In an embodiment, one or more voids 122 extend through the thickness T of land pad 118. Voids 122 reduce the conductive area of land pad 118 overlapping ground plane 105, according to an embodiment. As a result, the capacitance between ground plane 105 and land pad 118 may be reduced as compared to the capacitance between the ground plane and a solid land pad having the same contact area.

FIG. 1C illustrates a cross-sectional side view along line B-B' in FIG. 1A. In an embodiment, one or more vias 120 electrically couple land pad 118 with conductive trace 106. Conductive traces 106 and vias 108 route signals between land pad 118 and package components, such as a die (not shown) mounted on the opposite side of substrate 100, according to an embodiment. In an embodiment, conductive trace 106 passes through a void in ground plane 105. In an embodiment, via 108 and conductive trace 106 may affect the area of ground plane 105 overlapping with the conductive area of land pad 118. It is to be understood that substrate 100 may include additionally conductive traces and dielectric layers beyond those illustrated by example in FIG. 1C.

FIG. 2A illustrates a top-down view of a solid land pad 217 having a conductive area equal to the contact area. FIGS. 2B-2F illustrate a top-down view of a reduced capacitance land pad 218, according to an embodiment of the invention. A reduced capacitance land pad may include one or more voids having a variety of shapes, sizes and configurations. The contact area of land pad 218 is defined by the perimeter of the land pad, according to an embodiment. The contact area of land pads 218 may have a variety of shapes, such as rectangular or circular. In an embodiment, the length $L_c$ and width $W_c$ of land pad 218 define the contact area. The conductive area is defined as the contact area minus the area occupied by voids 222, according to an embodiment. Land pads 218 have a conductive area less than the contact area. In an embodiment, voids 222 occupy up to 60% of the contact area. In an embodiment, voids 222 occupy from 20% to 30% of the contact area.

In an embodiment, voids 222 are circular in cross-section, such as is shown in FIGS. 2B and 2C. Voids 222 may be arranged in a periodic array, as shown in FIG. 2B, or arranged randomly, as shown in FIG. 2C. Land pad 218 in FIG. 2B includes a voidless portion of the conductive area to which one or more vias may connect in order to couple land pad 218 to underlying conductive traces, according to an embodiment.

Voids 222 may also be polygonal in cross section, as shown in FIGS. 2D-2F. FIG. 2D illustrates a periodic array of rectangular voids 222, according to an embodiment. In another embodiment, rectangular voids 222 may be staggered, as shown in FIG. 2E. In an embodiment, voids 222 may extend nearly the full length of land pad 218, as shown in FIG. 2F. In an embodiment, land pad 218 include a plurality of distinct conductive areas, in which case each conductive area contacts at least one via coupling the conductive area to an underlying conductive trace. For example, in an embodiment, voids 222 in FIG. 2F may extend the full length of land pad 218. It is to be understood that additional shapes, sizes, and arrangements of voids 222 not shown in FIGS. 2B-2F may be used to reduce the conductive area of a land pad 218.

FIG. 3A illustrates a cross-sectional side view of an electronic device having reduced capacitance land pads, according to an embodiment of the invention. In an embodiment, a substrate 300 having a plurality of land pads 318 is shown encaged within a socket 382, which has a plurality of LGA contacts 330 that are arranged complementary to the array of the plurality of land pads 318. Land pads 318 are arranged and sized to enable the tip of LGA contacts 330 to make reliable electrical contact with substrate 300 via land pads 318.

The socket 382 is shown further coupled to a printed circuit board 370 by a plurality of electrical interconnects 384, such as solder balls. Contacts 374 couple an electrical device, such as a die 372, with the substrate 300, according to an embodiment. In an embodiment, an underfill material 376 may fill the space around contacts 374 underneath die 372. Additional active and passive components 380 may be mounted to substrate 300. A heat sink 387 may be thermally coupled to the surface of the substrate 300. In an embodiment, steps 384 are formed on heat sink 387 to receive the load applied by a loading fixture (not shown), which locks the packaged die into the socket 382.

FIGS. 3B-3C illustrate a cross-sectional side view and a top-down view of an LGA contact 330 in contact with a land pad 318, according to an embodiment of the invention. The dimensions of voids 322 enable first, the tip of LGA contact 330 to reliably electrically couple with the land pad 318, and second, reduction of the capacitance between the land pad 318 and a parallel ground layer within the substrate. The design of a reduced capacitance land pad 318—including overall contact area and void shape, size, and number—depends on a number of socket design parameters including the width 334 of the tip of the LGA contact 330. Additional socket design parameters, such as the degree of variance in the positioning of the LGA contact tips relative to the contact area of a land pad, the required clearance between the LGA contact tips and solder mask surrounding the land pads, the limitations on the wiping distance of the LGA contact tip to prevent overshooting the land pad, and clearance and tolerance between the surface of the socket and the substrate, are discussed below with respect to FIGS. 4A-4C.

In an embodiment, when LGA contacts 330 register with land pads 318, each contact pin 330 wipes along the land pad 318 in wiping direction 332 as the package is locked into the socket 382. LGA contacts 330 typically have a curved tip region, so that contact to the land pad 318 is made along a contact line oriented in the non-wiping direction 336. In an embodiment, in order to ensure electrical coupling between the tip of LGA contact 330 and the land pad 318, the largest width 338 in the non-wiping direction 336 of a void 318 is less than the contact tip width 334. This prevents the tip of the LGA contact 330 from seating within a void 322, where it may contact dielectric material exposed within the void without making electrical contact to conductive land pad material. In an embodiment, the edges of land pad 318 surrounding voids 322 are smoothed to prevent damage to the tip of LGA contact 330 as it wipes across the surface of the land pad 318. The shape, dimensions and number of voids 322 used to reduce the conductive area of a land pad 318 may be optimized to ensure adequate electrical contact and reduced capacitance. As such, it is possible to reduce and manage land pad capacitance by optimizing voids 322 in land pads 318, without making any further modifications to the socket or package structure.

Figure 4A:
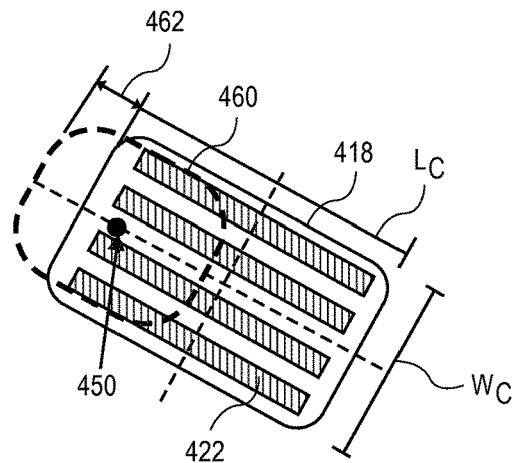
FIGS. 4A-4C illustrate a top-down view of LGA contact position zones relative to the contact area of a reduced capacitance land pad, in accordance with an embodiment of the invention.
Figure 4B:
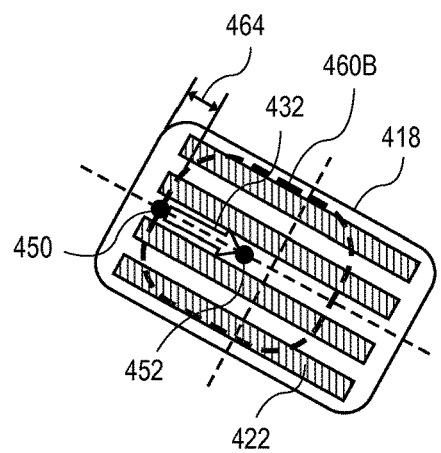
Figure 4C:
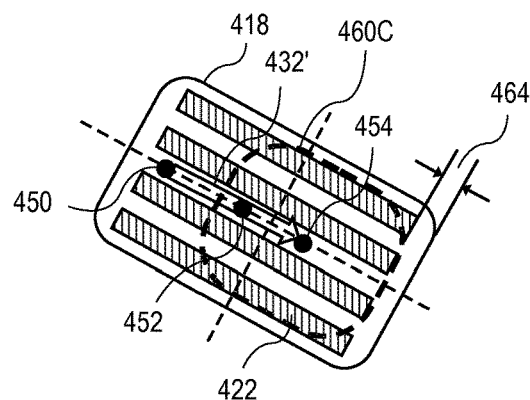

FIGS. 4A-4C illustrate top-down views of the LGA contact position zone 460A/460B/460C relative to the contact area of a land pad 418 during registration of an LGA contact with the land pad 418, according to an embodiment of the invention. The shape and size of the contact area of a land pad 418 is determined by the shape and size of position zone 460A/460B/460C, the wiping distance 432/432', and the minimum clearances and tolerances, for example between the tip of the LGA contact and the surrounding solder mask. Position zone 460A/460B/460C is the region in which the contact tip will contact the surface, within a certain degree of certainty. The size and location of the contact position zone 460A/460B/460C are determined by the width of the tip of the LGA contact, the contact tip position variance, and the required clearance between the contact tip and the solder mask surrounding the land pad.

FIG. 4A illustrates an example initial touch down position 450 within initial touchdown position zone 460A, according to an embodiment of the invention. The contact area of land pad 418 is defined by the perimeter of the land pad. In an embodiment, land pad 418 has a contact area defined by the exterior length $L_c$ and exterior width $W_c$. In an embodiment, upon initial touch down, position zone 460A includes a negative margin 462, which extends outside the contact area of land pad 418. FIG. 4B illustrates the minimum wiping distance 432 for the tip of the LGA contact from an initial touch down point 450 to a post wiping position 452, according to an embodiment. The minimum wiping distance required to ensure that the tip of an LGA contact, falling within position zone 460B, will have a positive margin 464 with respect to the edge of the contact area of the land pad 418. FIG. 4C illustrates the maximum wiping distance 432' permitted by the contact area of the land pad 418 given the position zone 460C, according to an embodiment of the invention. The maximum wiping distance 432' ensures a positive margin 464 between the edge of the contact area of the land pad 418 and the point of contact of the tip of the LGA contact within the variance zone 460C. In an embodiment, the tip of the LGA contact contacts the land pad 118 at post-wiping contact point 454 after wiping the maximum distance 432'.

Figure 5A:
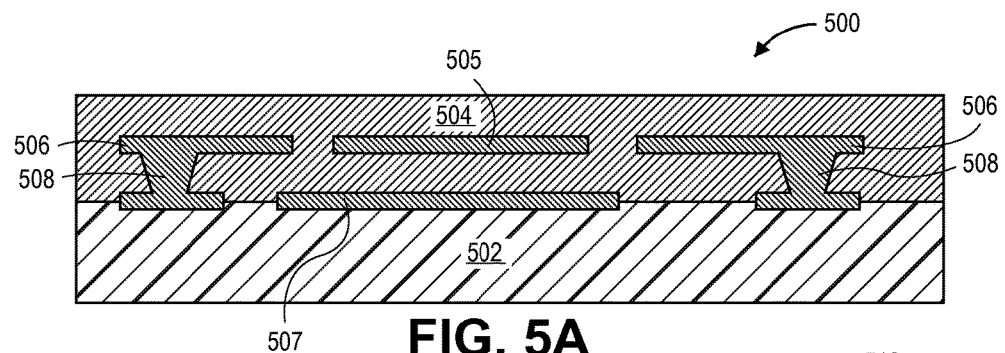
FIGS. 5A-5F illustrate cross-sectional side views of a method for forming a reduced capacitance land pad, in accordance with an embodiment of the invention.

FIGS. 5A-5F illustrate cross-sectional views of a method for forming a reduced capacitance land pad on a substrate, according to an embodiment of the invention. In FIG. 5A, a substrate 500 is provided. In an embodiment, substrate 500 includes a core 502 having dielectric layers 504 formed thereon. In an embodiment, dielectric layers 504 include conductive traces 506, vias 508, ground plane 505, and power plane 507. In an embodiment, conductive elements 506, 508, 505, and 507 are electrically coupled with conductive elements on the opposite side of core 502 by plated through holes (not shown) through core 502. Substrate 500 may be formed using conventional materials and processing techniques.

Figure 5B:
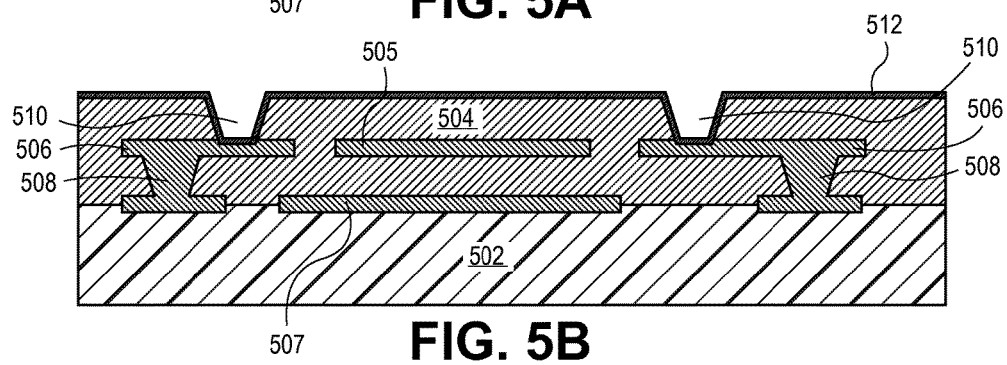

In FIG. 5B, vias 510 are formed in the outer dielectric layer 504, according to an embodiment of the invention. In an embodiment, vias 510 extend from the surface of dielectric material 504 to a conductive trace 506. In an embodiment, vias 510 are formed by mechanical or laser drilling dielectric material 504. Then, a seed layer 512 is formed over the top surface of the substrate 500, according to an embodiment. In an embodiment, seed layer 512 is electrolessly plated over dielectric material 504 and the surfaces of via 510. In an embodiment, seed layer 512 is copper. Seed layer 512 may be from 0.7 µm to 1.0 µm thick.

Figure 5C:
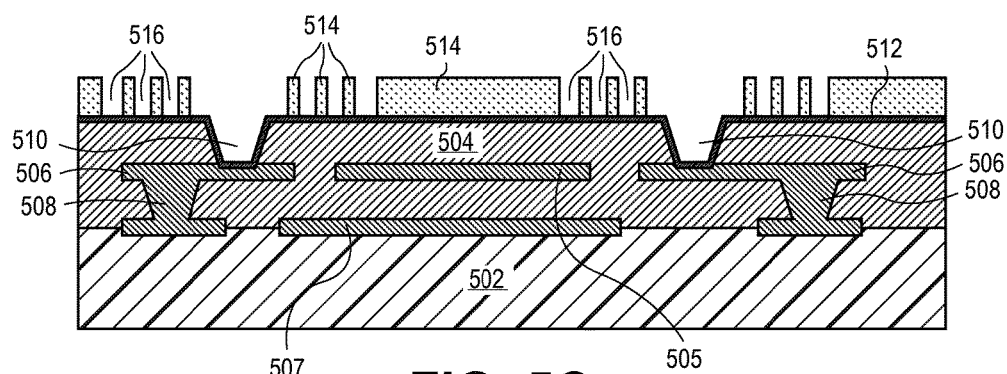

Next, in FIG. 5C, patterning layer 514 is formed on seed layer 512. In an embodiment, patterning layer 514 defines the shape of the land pad to be formed, along with the size, shape, and orientation of voids within the land pad by exposing the portions of seed layer 512 on which conductive land pad material will be electroplated. As such, patterning layer 514 may define the exterior dimensions of the land pad, and also the size, shape, and location of the voids that will reduce the conductive area of the land pad. In an embodiment, patterning layer 514 includes holes 516. In an embodiment, patterning layer 514 is formed using a dry film resist (DFR). A dry film resist or polymer is laminated over the surface of seed layer 512, according to an embodiment. The dry film resist may be patterned using photolithography, for example, by using a mask to define the areas to be removed, and then curing the exposed portions using UV light. The uncured portions of the dry film resist may then be removed, and the cured portions remain on the seed layer 512 as patterning layer 514.

Figure 5D:
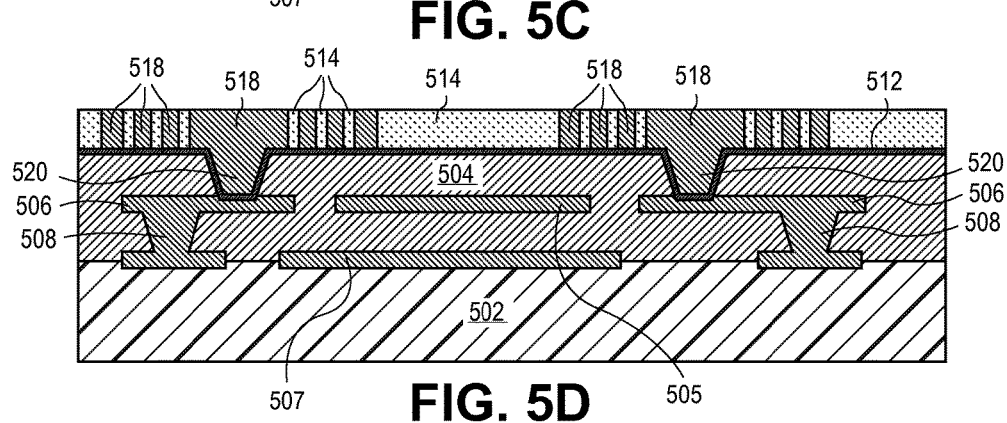

In FIG. 5D, land pad 518 is formed over the portions of seed layer 512 exposed by patterning layer 514, according to an embodiment of the invention. In an embodiment, land pad 518 is electroplated. In an embodiment, land pad 518 forms within holes 516 and via 510. Land pad 518 may be any suitable conductive material, such as, but not limited to, copper. In an embodiment, land pad 518 is from 10 µm to 20 µm thick.

Figure 5E:
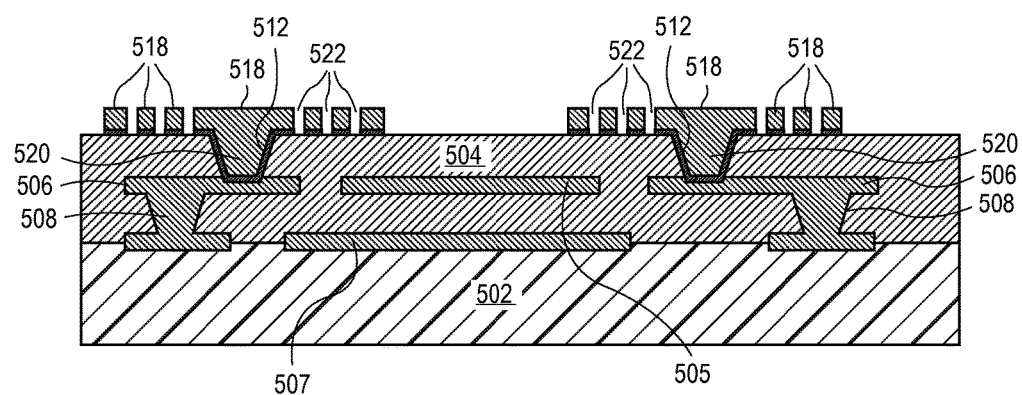

Next, in FIG. 5E, patterning layer 514 is removed. In an embodiment, the portions of seed layer 512 exposed by the removal of patterning layer 514 may then be removed, for example, by a quick etch process. In an embodiment, an additional palladium catalyst removal process is applied. In an embodiment, the removal of seed layer 512 exposes dielectric layer 504 through voids 522. Voids 522 reduce the conductive area of land pad 518 overlapping ground layer 505, according to an embodiment. The reduction in overlapping area reduces the capacitance between the land pad and ground layer 505.

Figure 5F:
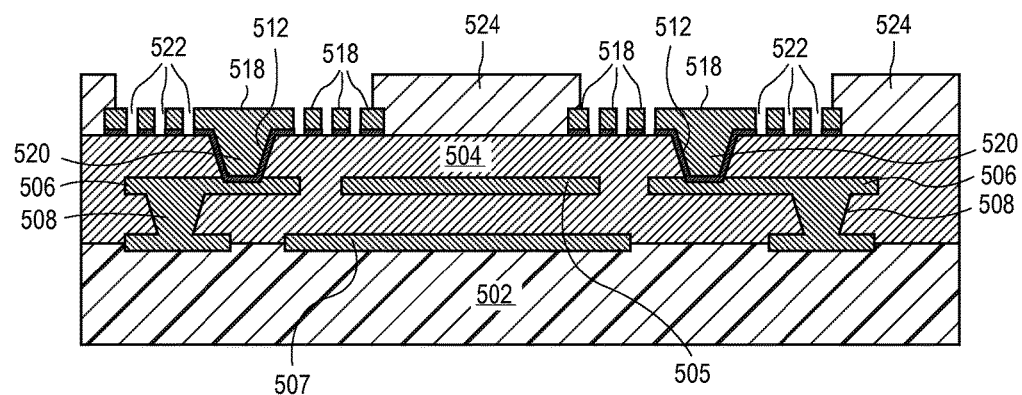

Next, in FIG. 5F, solder mask 524 is formed over dielectric material 504, according to an embodiment of the invention. In an embodiment, solder mask 524 overlaps the edge of land pad 518. In an embodiment, solder mask 524 is formed by DFR. First, a dry film resist or polymer is laminated over the surfaces of dielectric material 504 and land pad 518, according to an embodiment. The dry film resist may be patterned using photolithography, for example, by using a mask to define the areas to be removed, and then curing the exposed portions using UV light. The uncured portions of the dry film resist may then be removed, and the cured portions remain as solder mask 524.

Figure 6A:
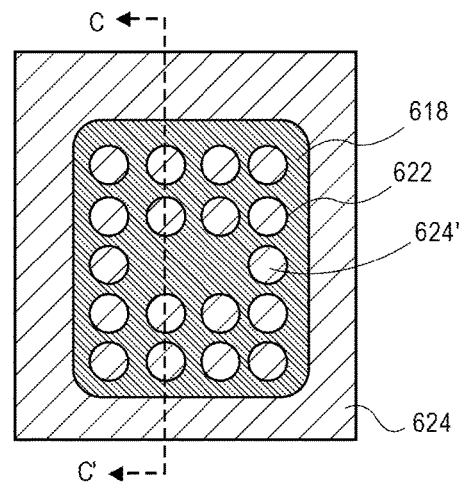
FIG. 6A illustrates a top-down view of a reduced capacitance land pad, in accordance with an embodiment of the invention.
Figure 6B:
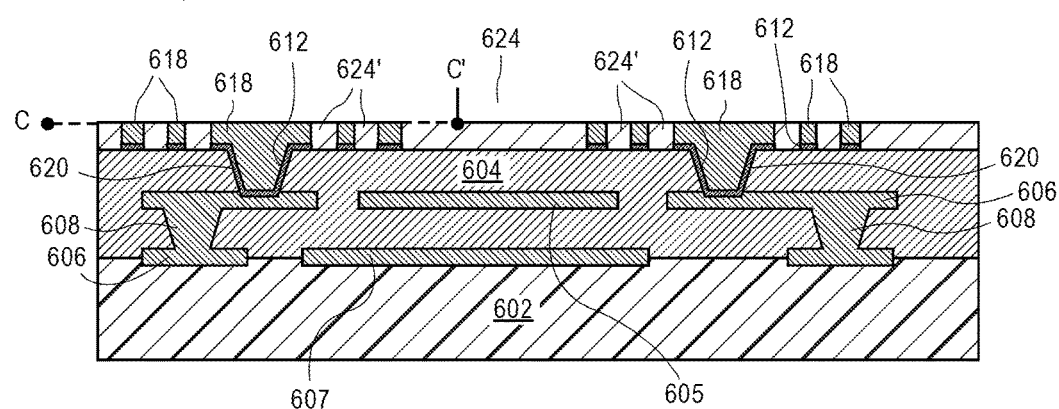
FIG. 6B illustrates a cross-sectional side view of a reduced capacitance land pad, in accordance with an embodiment of the invention.

FIGS. 6A-6B illustrate a reduced capacitance land pad having voids filled with an insulating material, according to an embodiment of the invention. FIG. 6A illustrates a top-down view of land pad 618, according to an embodiment. In an embodiment, land pad 618 is surrounded by solder mask 624. Land pad 618 has one or more voids 622, according to an embodiment of the invention. In an embodiment, voids 622 are filled with non-conductive material 624'.

FIG. 6B illustrates a cross-sectional side view along line C-C' in FIG. 6A. Land pad 618 is formed on a substrate 600 including core 602 and at least one dielectric layer 604. Dielectric layers 604 include conductive traces 606, vias 608, ground plane 605, and power plane 607, according to an embodiment of the invention. The components of substrate 600 may include any suitable materials, such as those discussed above with respect to substrate 100.

In an embodiment, land pads 618 are electrically coupled to conductive traces 606 by vias 620. In an embodiment, land pad 618 and via 620 are formed on seed layer 612. In an embodiment, land pad 618, via 620, and seed layer 612 are formed from copper. Land pad 618 includes voids 622, according to an embodiment. In an embodiment, voids 622 are at least partially filled with a material that does not capacitively couple with overlapping portions of parallel ground plane 605. As such, the conductive area of land pad 618 is reduced as compared to the contact area. In an embodiment, voids 622 are filled with solder mask material 624'.

To form a land pad 618 having filled voids 622, the land pad may be formed according to the method shown in FIGS. 5A-5E. In an embodiment, solder mask 624 is then formed over dielectric material 604 and land pads 618, and removed to expose the surface of land pads 618 without removing solder mask material 624 from within voids 622, according to an embodiment of the invention.

Filling voids 622 with a non-conductive material may allow use of land pads with BGA or PGA applications. For example, conductive solder bumps (not shown) may be formed on land pads 622. In an embodiment, the inclusion of insulating material 624' within voids 622 prevents conductive solder from filling the voids 622, thereby maintaining the reduced conductive area as compared to the contact area of land pad 618, and the associated reduced capacitance with parallel ground plane 605.

Figure 7:
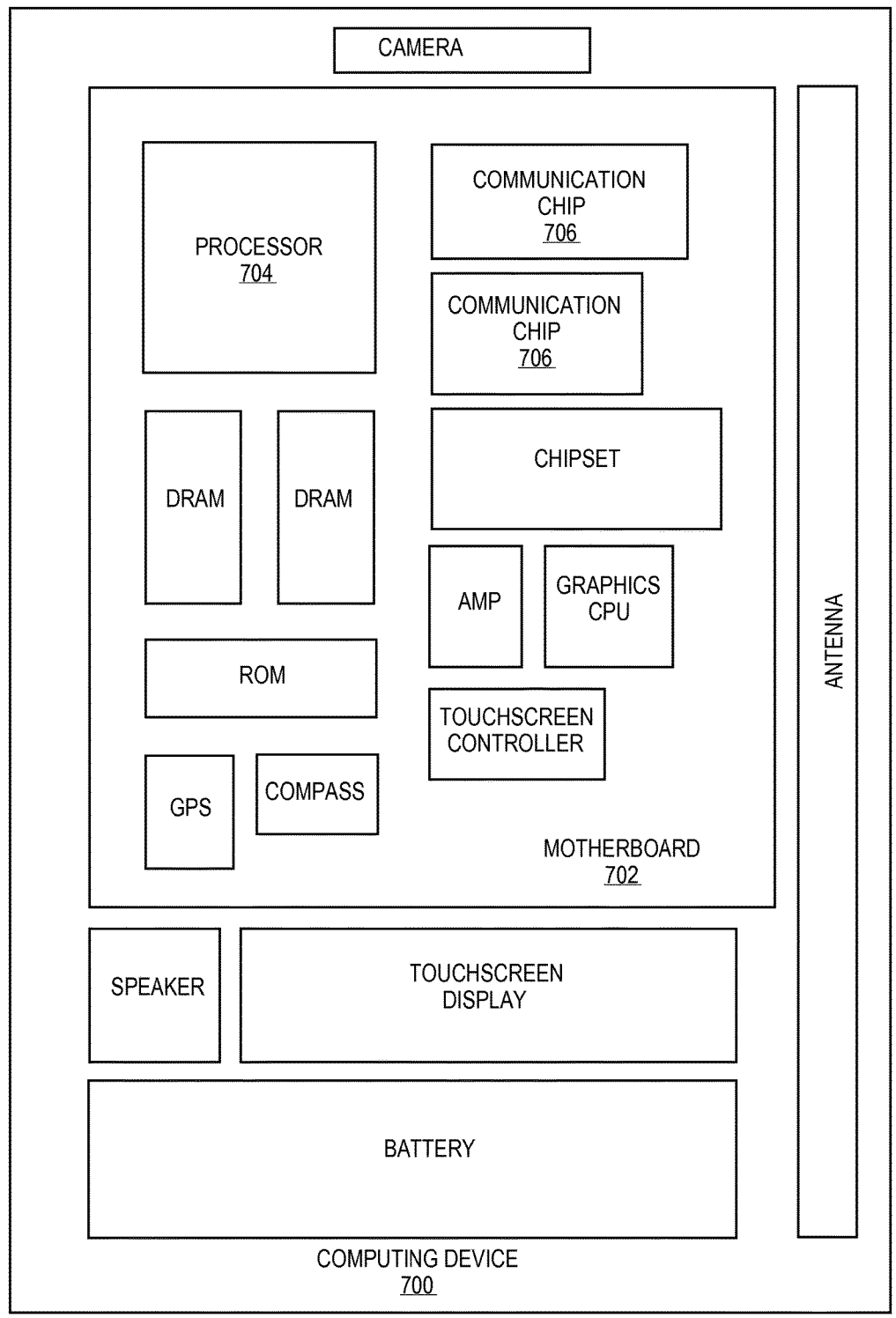
FIG. 7 illustrates a computing system implemented with a reduced capacitance land pad in accordance with an example embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others. The communication chip 706 also includes an integrated circuit die packaged within the communication chip 706. In an embodiment, communication chip 706 is coupled to the board 702 using land pads having an conductive area less than the pad area, in accordance with embodiments of the invention.

The processor 704 of the computing device 700 includes an integrated circuit die packaged within the processor 704. In an embodiment, processor 704 is coupled to the board 702 using land pads having an conductive area less than the pad area, in accordance with embodiments of the invention. The term "processor" may refer to any device or portion of a device that processes electronic data from registers and/or memory to transform that electronic data into other electronic data that may be stored in registers and/or memory.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

In an embodiment, a land pad comprises a conductive portion having a contact area and a thickness and one or more non-conductive voids extending through the thickness of the conductive portion. In an embodiment, the contact area is the area within a contact perimeter. The one or more voids may include a non-conductive material. The one or more voids may have a circular cross-section or a polygonal cross-section. In an embodiment, the conductive portion comprises copper. In an embodiment, the one or more voids occupy from 1% to 60% of the contact area. In an embodiment, the one or more voids occupy from 20% to 30% of the contact area.

In an embodiment, a structure comprises a substrate having one or more dielectric layers including a conductive trace and a ground plane and plurality of land pads on the surface of the substrate, the land pads each comprising a conductive portion electrically coupled with the conductive trace by one or more vias, the conductive portion having a contact area and a thickness, wherein the contact area is parallel to the ground plane and one or more non-conductive voids extending through the thickness of the conductive portion. In an embodiment, the contact area is defined by a contact perimeter. In an embodiment, the one or more voids include a non-conductive material. The one or more voids may have a circular cross-section or a polygonal cross-section. In an embodiment, the conductive portion comprises copper. In an embodiment, the structure further comprises a land grid array socket including a respective plurality of land grid array contacts in electrical contact with the plurality of land pads, wherein the one or more voids are sized and positioned to ensure electrical coupling of the land grid array contact with the land pad. In an embodiment, the one or more voids have a width less than a tip width of the land grid array contact. In an embodiment, the width is from 10 µm to 350 µm. In an embodiment, the one or more voids occupy from 1% to 60% of the contact area. In an embodiment, the one or more voids occupy 20-30% of the contact area.

In an embodiment, a method for forming a land pad, comprises forming a contact via through at least one outer dielectric layer of a substrate, wherein the contact via exposes a conductive trace within the substrate, electrolessly plating a seed layer over the outer dielectric layer and contact via, forming a patterning layer to define a pattern exposing portions of the seed layer, electroplating a conductive material onto exposed portions of the seed layer, and removing the patterning layer and portions of the seed layer underlying the patterning layer to form a land pad, the land pad comprising a conductive portion having a contact area and a thickness and one or more non-conductive voids extending through the thickness of the conductive portion. In an embodiment, forming a contact via comprises laser drilling the at least one outer dielectric layers to expose the conductive trace. In an embodiment, forming a patterning layer over the seed layer comprises laminating a dry film resist over the seed layer, arranging a mask over portions of the seed layer to be exposed, curing portions of the dry film resist exposed by the mask using UV light, and removing uncured portions of the dry film resist to expose the underlying seed layer. In an embodiment, the method further comprising forming a solder mask over the outer dielectric layer. In an embodiment, forming the solder mask comprises laminating a dry film resist over the outer dielectric layer and land pad, arranging a mask over the land pad, curing portions of the dry film resist exposed by the mask using UV light, and removing uncured portions of the dry film resist to expose the underlying land pad. In an embodiment, the solder mask is removed from the one or more voids. In an embodiment, the method further comprises filling the one or more voids with a non-conductive material.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A structure, comprising:
   a substrate having one or more dielectric layers including a conductive trace and a ground plane; and
   a plurality of land pads on the surface of the substrate, the land pads each comprising:
   a conductive portion electrically coupled with the conductive trace by one or more vias, the conductive portion having a contact area and a thickness, the contact area for making electrical contact to an individual land grid array (LGA) contact, wherein the contact area is parallel to the ground plane; and one or more non-conductive voids in the contact area and extending through the thickness of the conductive portion, wherein the conductive portion is continuous around the one or more non-conductive voids.

2. The structure of claim 1, wherein the contact area is defined by a contact perimeter.

3. The structure of claim 1, wherein the one or more voids include an non-conductive material.

4. The structure of claim 1, wherein the one or more voids have a circular cross-section.

5. The structure of claim 1, wherein the one or more voids have a polygonal cross-section.

6. The structure of claim 1, wherein the conductive portion comprises copper.

7. The structure of claim 1, further comprising a land grid array socket including a respective plurality of land grid array contacts in electrical contact with the plurality of land pads, wherein the one or more voids are sized and positioned to ensure electrical coupling of the land grid array contact with the land pad.

8. The structure of claim 7, wherein the one or more voids have a width less than a tip width of the land grid array contact.

9. The structure of claim 8, wherein the width is from 10 μm to 350 μm.

10. The structure of claim 1, wherein the one or more voids occupy from 1% to 60% of the contact area.

11. The structure of claim 1, wherein the one or more voids occupy 20-30% of the contact area.

\* \* \* \* \*